(12) United States Patent
Harada

(10) Patent No.: US 7,337,385 B2
(45) Date of Patent: Feb. 26, 2008

(54) DECODING APPARATUS AND METHOD FOR DECODING THE DATA ENCODED WITH AN LDPC CODE

(75) Inventor: Kohsuke Harada, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 419 days.

(21) Appl. No.: 11/158,061

(22) Filed: Jun. 22, 2005

(65) Prior Publication Data
US 2006/0005104 A1    Jan. 5, 2006

(30) Foreign Application Priority Data
Jun. 23, 2004    (JP)    ............................. 2004-185390

(51) Int. Cl.
*H03M 13/00*    (2006.01)
*H03M 13/03*    (2006.01)
(52) U.S. Cl. ..................... 714/781; 714/758; 714/794
(58) Field of Classification Search ................ 714/781, 714/758, 794
See application file for complete search history.

(56) References Cited

U.S. PATENT DOCUMENTS

| | | | |
|---|---|---|---|
| 6,757,117 B1* | 6/2004 | Livingston | 360/25 |
| 6,888,897 B1* | 5/2005 | Nazari et al. | 375/262 |
| 6,901,119 B2* | 5/2005 | Cideciyan et al. | 375/341 |
| 6,965,652 B1* | 11/2005 | Burd et al. | 375/341 |
| 7,000,177 B1* | 2/2006 | Wu et al. | 714/801 |
| 7,072,417 B1* | 7/2006 | Burd et al. | 375/295 |
| 7,184,486 B1* | 2/2007 | Wu et al. | 375/262 |
| 7,254,188 B2* | 8/2007 | Cannon et al. | 375/324 |
| 2005/0216821 A1 | 9/2005 | Harada | |

FOREIGN PATENT DOCUMENTS

| | | |
|---|---|---|
| JP | 2003-198383 | 7/2003 |
| JP | 3575606 | 7/2004 |

\* cited by examiner

*Primary Examiner*—Joseph D. Torres
(74) *Attorney, Agent, or Firm*—Finnegan, Henderson, Farabow, Garrett & Dunner, L.L.P.

(57) ABSTRACT

A channel condition detecting unit detects a condition of a channel between a transmitting apparatus and a receiving apparatus, in accordance with a pilot signal. A reference check matrix employed for LDPC coding in the transmitting apparatus is stored in the check matrix reconstructing unit. The check matrix reconstructing unit reconstructs the reference check matrix in accordance with a detection result of the channel condition detecting unit. An LDPC decoding unit obtains a probability value of each of bits in the receive data by executing the LDPC decoding operation based on a check matrix supplied from the check matrix reconstructing unit, for a likelihood value of each of the bits in an encoded bit sequence input from a detecting unit. A hard decision unit subjects a probability value of each of bits in the receive data to hard decision and obtains the receive data.

10 Claims, 7 Drawing Sheets

$$\begin{bmatrix} 1 0 0 1 0 1 1 0 \\ 0 1 1 0 1 1 0 0 \\ 0 1 0 1 0 0 1 1 \\ 1 0 1 0 1 0 0 1 \end{bmatrix}$$

$$\begin{bmatrix} 1 0 0 1 0 1 1 0 \\ 1 1 1 1 1 0 1 0 \\ 0 1 0 1 0 0 1 1 \\ 0 0 1 1 1 1 1 1 \end{bmatrix}$$

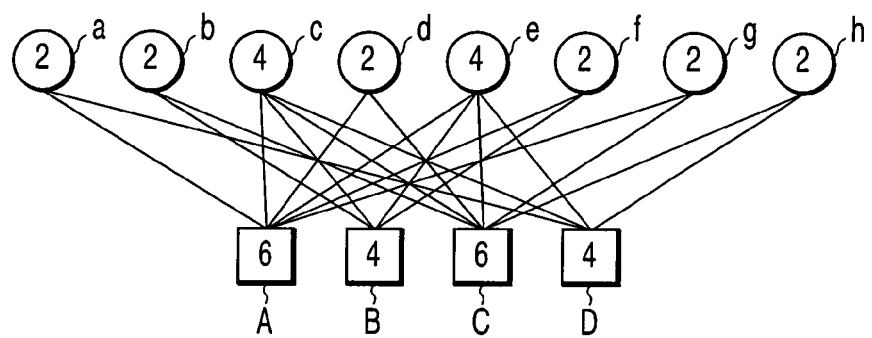
FIG. 6
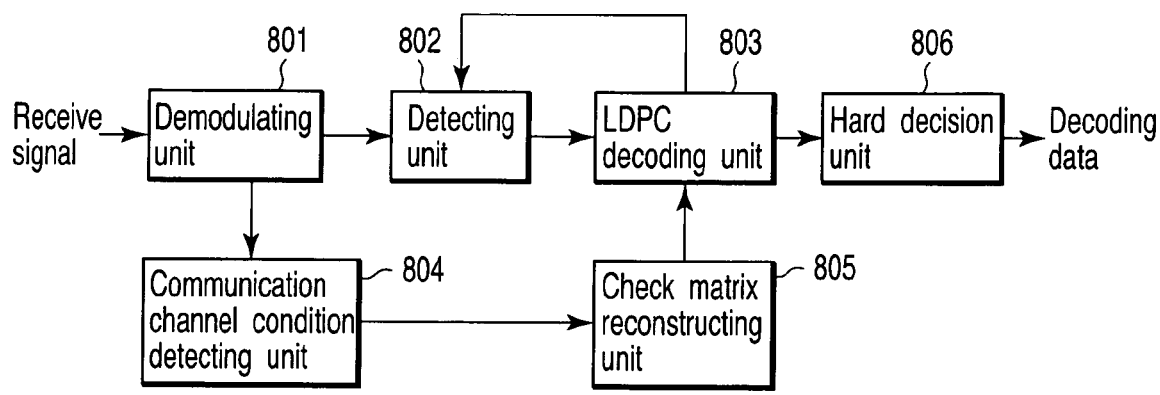
FIG. 7
FIG. 8

DECODING APPARATUS AND METHOD FOR DECODING THE DATA ENCODED WITH AN LDPC CODE

CROSS-REFERENCE TO RELATED APPLICATIONS

This application is based upon and claims the benefit of priority from prior Japanese Patent Application No. 2004-185390, filed Jun. 23, 2004, the entire contents of which are incorporated herein by reference.

BACKGROUND OF THE INVENTION

1. Field of the Invention

This invention relates to a decoding apparatus and method using an LDPC (Low Density Parity Check) code employed in, for example, a communications system, information input/output system and the like.

2. Description of the Related Art

As is well known, an LDPC code is a block code defined by a sparse check matrix and is decoded by repetitive decoding. The LDPC code is created on a bipartite graph, and has a characteristic that a structure of the bipartite graph gives a great influence to a transmission error rate characteristic.

It is known that the LDPC code can form an efficient encoder by optimizing the structure of the bipartite graph. A method of forming a substantially optimum encoder is now introduced into a binary symmetric communication channel (transmission path between the transmitter and the receiver).

In addition, a method of obtaining an optimum encoder structure by executing feedback from a receiving side to a transmitting side, in a channel other than the binary symmetric channel or a channel changed in time or frequency, is conceived (for example, Jpn. PAT. Appln. KOKAI Publication No. 2003-198383).

Examples of the channel changed in time are CDMA (Code Division Multiple Access), OFDM (Orthogonal Frequency Division Multiplexing), and the like as employed in the mobile communications including fading and the indoor communications including many multi-paths.

Examples of the modulating method of the channel other than the binary symmetric channel are M-value PSK (Phase Shift Keying), M-value QAM (Quadrature Amplitude Modulation), M-value ASK (Amplitude Shift Keying), M-value AMPM (Amplitude Modulation-Phase Modulation), M-value PPM (Pulse Position Modulation), and the like.

In the above-explained method of executing feedback from the receiving side to the transmitting side, however, both the transmitting (encoding) side and the receiving (decoding) side need to reconstruct the system in accordance with the conditions of the channel, and a feedback channel allowing the conditions of the channel to be transmitted from the receiving side to the transmitting side needs to be secured. For this reason, if the encoder structure is optimized in the conventional method, the efficiency of use of the channel is low and the speed of adapting to the conditions of the channel is slow.

BRIEF SUMMARY OF THE INVENTION

The present invention has been accomplished to solve the above-described problems. The object of the present invention is to provide a decoding apparatus wherein even if a channel other than the binary symmetric channel or a channel changed in time and frequency is employed, the efficiency of use of the channel is not lowered and the speed of adapting to the channel condition is high.

According to an aspect of the present invention, there is provided a decoding apparatus capable of decoding data encoded with an LDPC code, the encoded data being transmitted from a transmitter. The decoding apparatus comprises a detecting unit configured to detect a received signal to obtain a likelihood value of each of binary bits of the encoded data, a check matrix reconstruction unit configured to reconstruct a check matrix of a preset LDPC code by matrix manipulations to obtain a derivative matrix of the check matrix; and a decoding unit configured to decode the encoded data by using the likelihood value in accordance with the derivative matrix.

According to the decoding apparatus of the present invention, a decoding operation is performed by converting a check matrix into a derivative matrix, even if a channel other than the binary symmetric channel or a channel changed in time and frequency is employed. Therefore, the efficiency of use of the channel does not become lowered. The speed of adapting to the channel condition becomes high.

BRIEF DESCRIPTION OF THE SEVERAL VIEWS OF THE DRAWING

FIG. 6 shows a matrix illustrating the operation of the receiving apparatus shown in FIG. 5;

FIG. 7 shows an illustration of the operation of the receiving apparatus shown in FIG. 5;

FIG. 8 shows a block diagram of a modified example of the receiving apparatus shown in FIG. 5;

DETAILED DESCRIPTION OF THE INVENTION

Embodiments of the present invention will be explained below with reference to the accompanying drawings.

Figures 1, 2, 3:
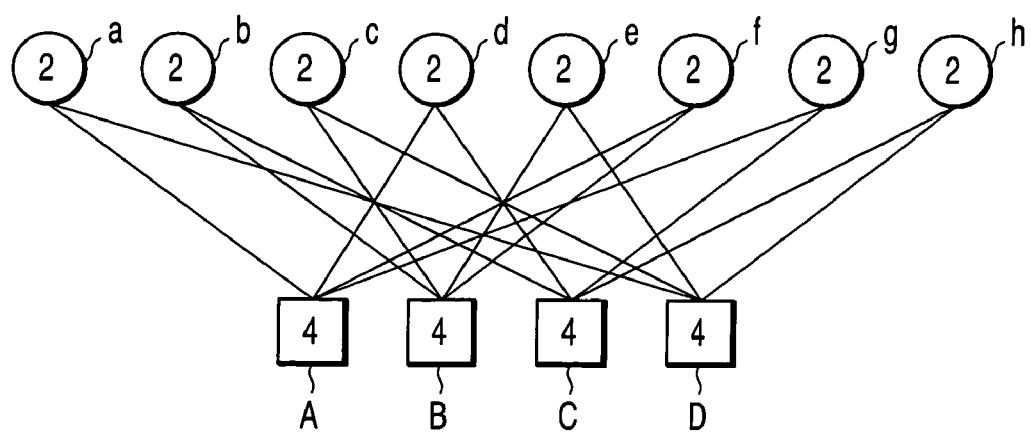
FIG. 1 shows an illustration of a principle of operation in a receiving apparatus according to a first embodiment of the present invention.
FIG. 2 shows a matrix illustrating the principle of operation in the receiving apparatus according to the first embodiment of the present invention.
FIG. 3 shows a matrix illustrating the principle of operation in the receiving apparatus according to the first embodiment of the present invention.

When the LDPC code is employed, an encoder is formed on a bipartite graph. Information is coded by generator matrix, which is generated by a check matrix based on the encoder. For example, if the encoder is represented by the bipartite graphs as shown in FIG. 1, the check matrix is formed as shown in FIG. 2. In FIG. 1, a, b, c, d, e, f, g, h represent variable nodes and A, B, C, D represent check nodes. The number in each of circles of the variable nodes and squares of the check nodes represents the number of connections with other nodes.

In the check matrix, row vectors correspond to the variable nodes a, b, c, d, e, f, g, h, respectively and column vectors correspond to the check nodes A, B, C, D, respectively. In addition, "1" indicates that the variable node and the check node corresponding thereto are linked with each other while "0" indicates that the variable node and the check node corresponding thereto are not linked.

In this check matrix, the same operations as general determinants can be executed. For example, arbitrary row vectors are added or exchanged as operations of the general determinants. It is known that the determinants obtained by the operations are derived from the preoperated determinants and that operation results are invariable. In other words, even if arbitrary row vectors in the check matrix employed for the LDPC are added or exchanged, functions of an encoder are the same. Needless to say, decoder operations are also the same.

For example, if the first row is added to each of the second row and the fourth row in the check matrix shown in FIG. 2, a check matrix shown in FIG. 3 can be obtained. A bipartite graph corresponding to the check matrix (hereinafter called derivative check matrix) obtained by such row operations, as shown in FIG. 4, is different from the bipartite graphs of FIG. 1.

Figure 4:
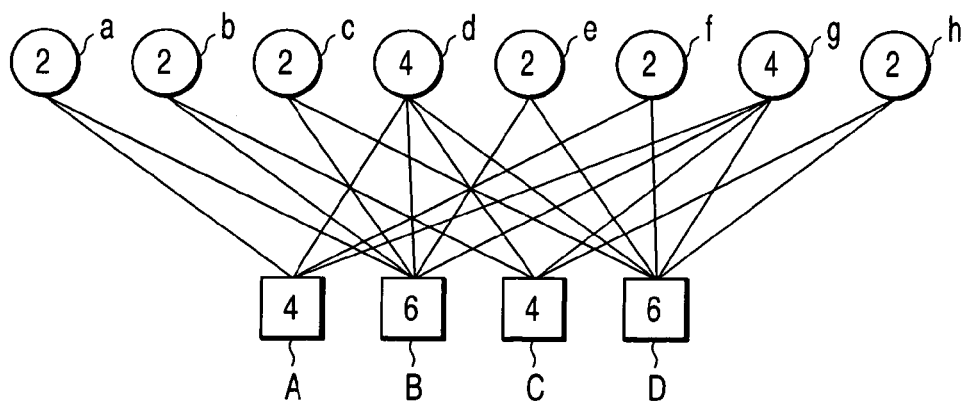
FIG. 4 shows a matrix illustrating the principle of operation in the receiving apparatus according to the first embodiment of the present invention.

However, the encoder operation is the same, even in the check matrix of FIG. 2 (i.e. the bipartite graphs of FIG. 1) and the derivative check matrix of FIG. 3 (i.e. the bipartite graphs of FIG. 4). By employing either of the check matrices, coding sequences created by employing the check matrix of FIG. 2 can be thereby decoded.

Thus, executing the row operations in the check matrix does not give influence to the decoding. However, reconstructing the check matrix by the row operations modifies the structure of the bipartite graph and varies the characteristics of the entire communications system.

The present inventors has noticed this point to provide a high-reliability decoding system capable of adapting to the change in time and frequency of the channel by varying the decoding characteristics of the LDPC code by the matrix manipulations of the check matrix.

Next, application of a decoding circuit according to the present invention to a decoding apparatus provided in the receiving apparatus of the communications system will be explained.

Figure 5:
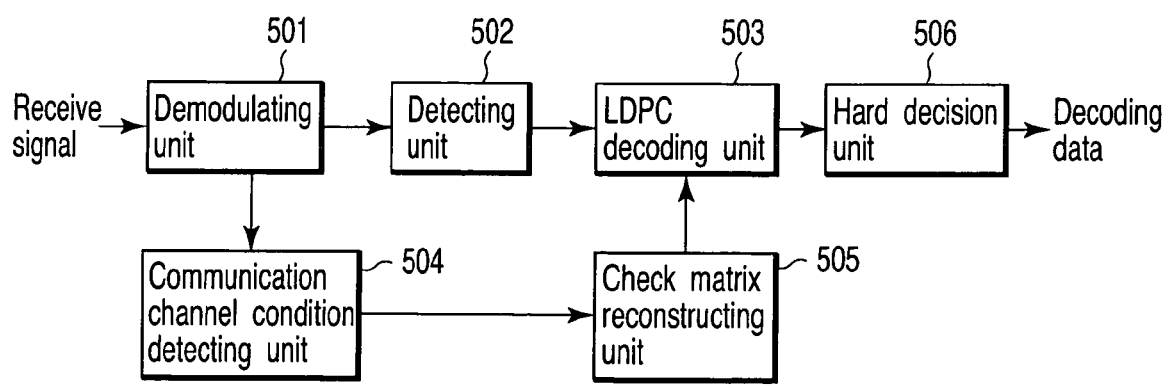
FIG. 5 shows a block diagram of the receiving apparatus according to the first embodiment of the present invention.

FIG. 5 shows a structure of a receiving apparatus according to a first embodiment of the present invention. The receiving apparatus comprises a demodulating unit 501, a detecting unit 502, an LDPC decoding unit 503, a channel condition detecting unit 504, a check matrix reconstructing unit 505 and a hard decision unit 506.

The demodulating unit 501 receives a radio signal transmitted from a transmitting apparatus via an antenna (not shown) and demodulates the received radio signal in the scheme of, for example, 8PSK (Phase Shift Keying). The detecting unit 502 outputs a likelihood value of each of bits in an encoded bit sequence by detecting a demodulation result of the demodulating unit 501. The likelihood value of each bit is output to the LDPC decoding unit 503.

The channel condition detecting unit 504 detects a condition of the channel between the transmitting apparatus and the receiving apparatus, in accordance with a pilot signal, of the demodulation result of the demodulating unit 501. Information indicating the detected channel condition is output to the check matrix reconstructing unit 505 as channel information.

A check matrix (hereinafter called reference check matrix) employed for LDPC coding in the transmitting apparatus is stored in the check matrix reconstructing unit 505. The check matrix reconstructing unit 505 performs the row operations on the reference check matrix and reconstructs the reference check matrix in accordance with the channel information supplied from the channel condition detecting unit 504 to obtain a check matrix (hereinafter called derivative check matrix) derived from the reference check matrix. The derivative check matrix obtained by the reconstructing is supplied to the LDPC decoding unit 503.

The LDPC decoding unit 503 outputs a probability value of each of bits in the receive data by performing the LDPC decoding operation based on the derivative check matrix supplied from the check matrix reconstructing unit 505, on the likelihood value of each of the bits in the encoded bit sequence input from the detecting unit 502. The hard decision unit 506 performs hard decision on the probability value and obtains the receive data.

Next, the operation of reconstructing the check matrix by the check matrix reconstructing unit 505 will be described.

In accordance with the channel condition detected by the channel condition detecting unit 504, the check matrix reconstructing unit 505 performs the row operations on the reference check matrix so as to change the degree of each variable node in the bipartite graphs (i.e. the number of branches linked with each variable node).

It is assumed here that the reference check matrix stored in the check matrix reconstructing unit 505 is identical with the check matrix as shown in FIG. 2. In this case, the bipartite graphs have the structure shown in FIG. 1 as explained above. For example, if the channel condition detected by the channel condition detecting unit 504 indicates that the likelihood value assigned to variable node c of low reliability, the check matrix reconstructing unit 505 performs the row operations on the reference check matrix such that the number of branches linked with variable node c increases.

In FIG. 1, variable node c is linked with check nodes B and D, but not with check node A or C. The check matrix reconstructing unit 505 detects this connection and adds the row vector corresponding to linked check node A to the row vectors corresponding to non-linked check nodes B and D on the basis of exclusive-OR.

By performing such row operations, the reference check matrix becomes a derivative check matrix as shown in FIG. 6. In other words, a bipartite graph shown in FIG. 7 is formed and the degree of variable node c to which the likelihood value of low reliability is assigned is increased, by the row operations of the check matrix reconstructing unit 505.

Thus, the derivative check matrix obtained by the check matrix reconstructing unit 505 is supplied to the LDPC decoding unit 503. The LDPC decoding unit 503 thereby performs the operation about variable node c at times whose number is more than the number of times of executing the LDPC decoding operation with the reference check matrix. In other words, the number of times of performing the operation about the variable node having the likelihood value of low reliability is increased and, therefore, the reliability can be enhanced.

In the receiving apparatus having the above-described structure, the condition of the channel with the transmitting apparatus is monitored by the channel condition detecting unit 504, the prestored reference check matrix is reconstructed on the basis of the monitoring result, and decoding is executed by the LDPC decoding operation based on the derivative check matrix obtained by the reconstruction.

According to the receiving apparatus having the above-described structure, the employed channel is not limited to the binary symmetric channel. Even if a channel changed in time and frequency is employed, decoding can be executed by using the derivative check matrix responding to the channel condition and high transmission quality can be thereby obtained. In addition, since negotiation with the transmitting side does not need to be made, the efficiency of use of the channel is not lowered and the speed of adapting to the channel condition is high.

The present invention is not limited to the above-described embodiment. For example, the present invention can also be applied to a case where the transmit data is interleaved in the transmitting apparatus. In this case, a deinterleaver is provided between the detecting unit 502 and the LDPC decoding unit 503. The deinterleaver deinterleaves the output of the detecting unit 502 and outputs the deinterleaving result to the LDPC decoding unit 503.

In the above-described embodiment, LDPC decoding unit 503 performs the LDPC decoding operation on the basis of the derivative check matrix reconstructed by the check matrix reconstructing unit 505. Instead of this, for example, the LDPC decoding unit 503 may perform the LDPC decoding operation on the basis of the initially preset reference check matrix and, during iterative operation of this LDPC decoding operation, perform the LDPC decoding operation in accordance with derivative check matrix reconstructed by the check matrix reconstructing unit 505.

Reconstructing the check matrix by the check matrix reconstructing unit 505 may be executed for each block of the LDPC. In addition, a plurality of blocks may be decoded by employing the same check matrix on the basis of the detection result of the channel condition detecting unit 504.

Moreover, a structure shown in FIG. 8 can also be conceived. In a decoding apparatus shown in FIG. 8, the decoding result initially obtained by the LDPC decoding unit 503 of the decoding apparatus shown in FIG. 5 is reflected on the detection result of the detecting unit 502 as a weighting factor.

In FIG. 8, a detecting unit 802 outputs a likelihood value of each of bits in an encoded bit sequence by detecting a demodulation result of a demodulating unit 801.

The likelihood value of each bit is temporarily stored in a buffer memory provided inside the detecting unit 802 and output to an LDPC decoding unit 803.

A channel condition detecting unit 804 detects a condition of the channel between the transmitting apparatus and the receiving apparatus, in accordance with a pilot signal, of the demodulation result of the demodulating unit 801. Information indicating the detected channel condition is output to a check matrix reconstructing unit 805 as channel information.

A check matrix (hereinafter called reference check matrix) employed to construct generator matrix for LDPC coding in the transmitting apparatus is stored in the check matrix reconstructing unit 805. The check matrix reconstructing unit 805 reconstructs the reference check matrix in response to the channel information supplied from the channel condition detecting unit 804. A check matrix (hereinafter called derivative check matrix) obtained by the reconstruction is supplied to the LDPC decoding unit 803.

The LDPC decoding unit 803 outputs a probability value of each of bits in the receive data by performing the LDPC decoding operation based on the derivative check matrix supplied from the check matrix reconstructing unit 805, on the likelihood value of each of the bits in the encoded bit sequence input from the detecting unit 802. The probability value is output to the detecting unit 802 as a prior probability value.

The detecting unit 802 weights each of the likelihood values stored in the buffer memory with the prior probability value corresponding thereto. Thus, the likelihood value of each of bits in the encoded bit sequence obtained by the detection is weighted with the prior probability value and the weighted likelihood value is output to the LDPC decoding unit 803.

The LDPC decoding unit 803 performs the LDPC decoding operation using the derivative check matrix reconstructed by the check matrix reconstructing unit 805, on the weighted likelihood value, and obtains the probability value of each of bits in the receive data. The probability value is output to a hard decision unit 806 as a secondary probability value. The hard decision unit 806 executes hard decision of the secondary probability value to obtain the receive data.

In the receiving apparatus having the above-described structure, the condition of the channel with the transmitting apparatus is monitored by the channel condition detecting unit 804, the prestored reference check matrix is reconstructed in accordance with the monitoring result, and the probability value is obtained by the LDPC decoding unit 803. After that, the probability value is reflected on the likelihood value to be subjected to the LDPC decoding as the weight and is further processed in the LDPC decoding operation by the LDPC decoding unit 803. Higher transmission quality can be therefore obtained.

Figure 9:
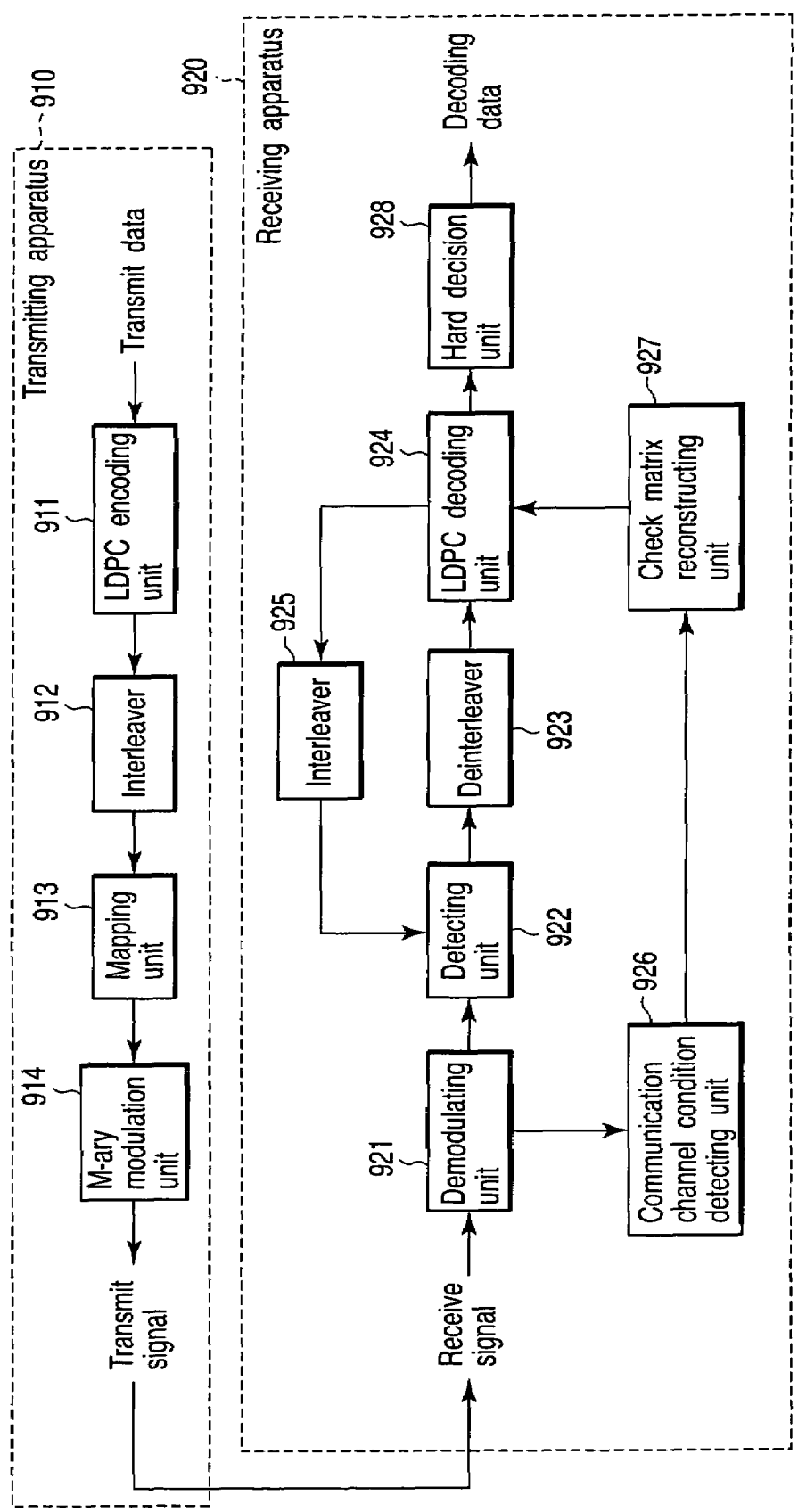
FIG. 9 shows a block diagram of a communications system to which the modified example of the receiving apparatus shown in FIG. 5 is applied.

Incidentally, the transmit data is often interleaved in the transmitting apparatus, to maintain independence of the encoded data and the transmit symbol. The above-described structure can also be applied to this case. An example of the structure of the communications system executing the interleaving is shown in FIG. 9.

In a transmitting apparatus 910, an LDPC encoding unit 911 encodes transmit data on the basis of the reference check matrix and outputs the encoded bit sequence. The bit sequence is interleaved by an interleaver 912.

A mapping unit 913 executes mapping to split the bit sequence interleaved by the interleaver 912 into bit sequences of a unit corresponding to a M-ary modulation unit 914 of a subsequent stage (M takes an arbitrary positive value). The M-ary modulation unit 914 executes M-ary modulation based on a mapping result of the mapping unit 913. For example, the M-ary modulation unit 914 executes M-ary modulation of a carrier wave in the 8PSK or the like using the mapped bit sequence. A transmit signal thus obtained is transmitted to a receiving apparatus 920 via an antenna (not shown).

In the receiving apparatus 920, the transmit signal is received by the antenna (not shown) as a receive signal, which is input to a demodulating unit 921. The demodulating unit 921 demodulates the receive signal in the 8PSK scheme. A detecting unit 922 detects a demodulating result of the demodulating unit 921 and obtains the likelihood value of each of bits in the encoded bit sequence. The likelihood value of each bit is temporarily stored in a buffer memory provided in the detecting unit 922, and is also deinterleaved by a deinterleaver 923 and output to an LDPC decoding unit 924.

A channel condition detecting unit 926 detects a condition of the channel between the transmitting apparatus 910 and the receiving apparatus 920, in accordance with a pilot signal, of the demodulation result of the demodulating unit 921. Information indicating the detected channel condition is output to a check matrix reconstructing unit 927 as channel information.

A reference check matrix employed for construction of generator of LDPC coding in the transmitting apparatus 910 is stored in the check matrix reconstructing unit 927. The check matrix reconstructing unit 927 reconstructs the reference check matrix in accordance with the channel information supplied from the channel condition detecting unit 926 to obtain a check matrix (hereinafter called derivative check matrix) derived from the reference check matrix. The derivative check matrix obtained by the reconstruction is supplied to the LDPC decoding unit 924.

The LDPC decoding unit 924 outputs a probability value of each of bits in the receive data by performing the LDPC decoding operation based on the derivative check matrix supplied from the check matrix reconstructing unit 927, on the likelihood value of each of the bits in the deinterleaved bit sequence input from the deinterleaver 923. The probability value is interleaved in an interleaver 925 and output to the detecting unit 922 as a prior probability value.

The detecting unit 922 weights each of the likelihood values stored in the buffer memory with the prior probability value corresponding thereto. Thus, the likelihood value of each of bits in the encoded bit sequence obtained by the detection is weighted with the prior probability value and the weighted likelihood value is output to the deinterleaver 923.

The deinterleaver 923 deinterleaves the weighted likelihood value and then outputs the weighted likelihood value to the LDPC decoding unit 924. The LDPC decoding unit 924 performs the LDPC decoding operation using the derivative check matrix reconstructed by the check matrix reconstructing unit 927, on the weighted likelihood value, and obtains the probability value of each of bits in the receive data.

The probability value is output to a hard decision unit 928 as a secondary probability value. The hard decision unit 928 executes hard decision of the secondary probability value to obtain the receive data.

As described above, if interleaving is executed in the transmitting apparatus 910, the deinterleaver 923 is provided between the detecting unit 922 and the LDPC decoding unit 924 and the interleaver 925 is provided in the feedback loop.

Figure 10:
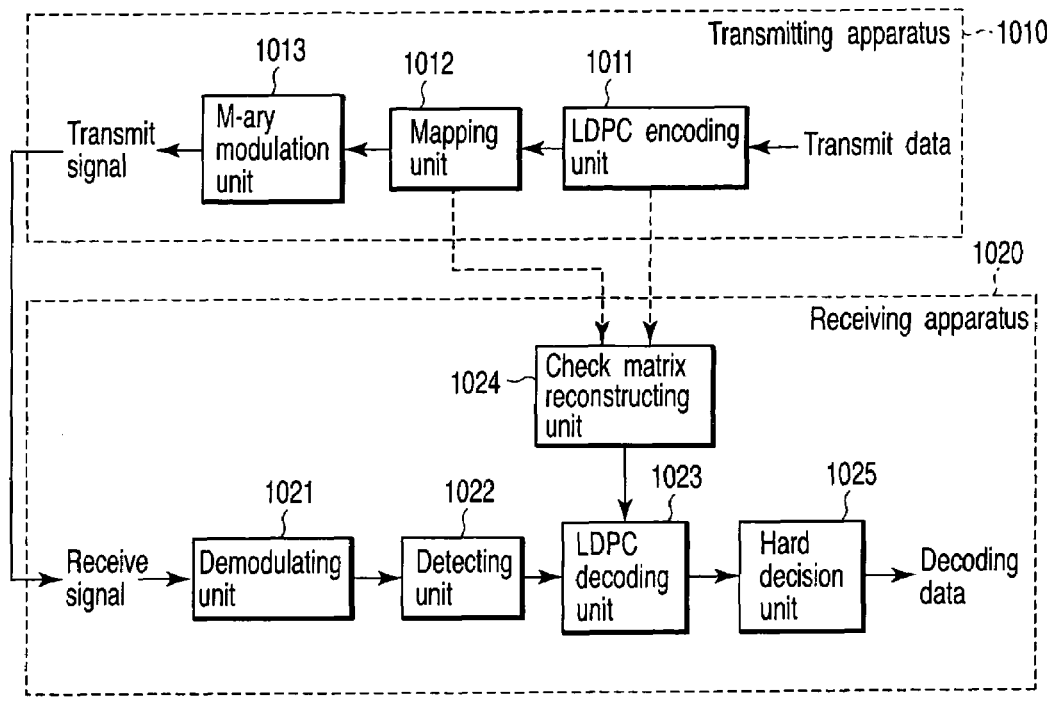
FIG. 10 shows a block diagram of a receiving apparatus according to a second embodiment of the present invention.

Next, a receiving apparatus 1020 according to a second embodiment of the present invention will be described. FIG. 10 shows a structure of a transmitting apparatus 1010 which transmits a transmit signal to the receiving apparatus 1020 and a structure of the receiving apparatus 1020.

In the transmitting apparatus 1010, an LDPC encoding unit 1011 encodes transmit data on the basis of the reference check matrix and outputs the encoded bit sequence. A mapping unit 1012 executes mapping to split the encoded bit sequence into bit sequences of a unit corresponding to a M-ary modulation unit 1013 of a subsequent stage.

The M-ary modulation unit 1013 executes M-ary modulation based on a mapping result of the mapping unit 1012. For example, the M-ary modulation unit 1013 executes M-ary modulation of a carrier wave in the 8PSK or the like using the mapped bit sequence. A transmit signal thus obtained is transmitted to the receiving apparatus 1020 via an antenna (not shown).

In the receiving apparatus 1020, the transmit signal is received by the antenna (not shown) as a receive signal, which is input to a demodulating unit 1021. The demodulating unit 1021 demodulates the receive signal in the 8PSK scheme. A detecting unit 1022 detects a demodulating result of the demodulating unit 1021 and obtains the likelihood value of each of bits in the encoded bit sequence. The likelihood value of each bit is output to an LDPC decoding unit 1023.

A check matrix reconstructing unit 1024 stores the reference check matrix employed for LDPC coding in the transmitting apparatus 1010 and corresponds to a mapping algorithm of the mapping unit 1012. In accordance with the reference check matrix and the mapping algorithm, the check matrix reconstructing unit 1024 reconstructs the reference check matrix to obtain a check matrix (hereinafter called derivative check matrix) derived from the reference check matrix. The derivative check matrix obtained by the reconstruction is supplied to the LDPC decoding unit 1023.

The LDPC decoding unit 1023 outputs a probability value of each of bits in the receive data by performing the LDPC decoding operation based on the derivative check matrix supplied from the check matrix reconstructing unit 1024, on the likelihood value of each of the bits input from the detecting unit 1022. A hard decision unit 1025 executes hard decision of the probability value and obtains the receive data.

Next, the operation of reconstructing the check matrix by the check matrix reconstructing unit 1024 will be described.

The check matrix reconstructing unit 1024 performs row operations on the reference check matrix so as to change the degree of each of variable nodes in the bipartite graphs (i.e. the number of branches linked with each variable node) in accordance with the reference check matrix and the mapping algorithm employed in the transmitting apparatus 1010.

Figure 11:
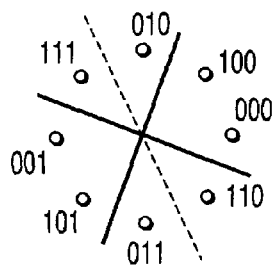
FIG. 11 shows an illustration of reliabilities of bits forming signal points of 8PSK modulation.

In the M-ary modulation unit 1013 having the above-described structure, 8PSK modulation is executed. In the 8PSK modulation, a symbol represents 3-bit data as shown in FIG. 11 but the each of bits has different in error probability. In other words, data of the first bit is different as compared with adjacent signal points. In the data, errors will occur at high possibility and the error probability is high.

On the other hand, data of the third bit is common in signal points in two groups divided by a broken line. In the data, errors will occur at little possibility and the error probability is low as compared with the data of the first bit. Data of the second bit is common in signal points in four groups divided by solid lines. In the data, errors will occur at little possibility as compared with the data of the first bit but occur at high possibility as compared with the data of the third bit.

Thus, a plurality of bits mapped at the same signal points are different in error probability. For this reason, the check matrix reconstructing unit 1024 performs the row operations on the reference check matrix such that the variable nodes to which bits of high error probability are assigned have more number of branches linked with the check nodes.

The derivative check matrix thus reconstructed by the check matrix reconstructing unit 1024 is supplied to the LDPC decoding unit 1023. The LDPC decoding unit 1023 thereby performs the operation concerning the variable nodes to which bits of high error probability are assigned, at more times than the LDPC decoding operation employing the reference check matrix. In other words, as for the likelihood value of little reliability, the reliability is enhanced by increasing the number of times of performing the operation of the variable nodes.

As described above, in the receiving apparatus 1020, which corresponds to the M-ary modulation, the reference check matrix prestored in the check matrix reconstructing unit 1024 is reconstructed in accordance with the error rate of each bit represented by one symbol and the decoding is executed in the LDPC decoding operation based on the derivative check matrix obtained by the reconstruction.

Consequently, according to the receiving apparatus 1020 having the above-described structure, even if the M-ary modulation is employed, decoding can be executed by reconstructing the check matrix and increasing the number of times of performing the operation concerning the likelihood of little reliability, and high transmission quality can be therefore obtained.

The present invention is not limited to the above-described embodiment. For example, the present invention can also be applied to a case where the transmit data is interleaved in the transmitting apparatus 1010. In this case, a deinterleaver is provided between the detecting unit 1022 and the LDPC decoding unit 1023. The deinterleaver deinterleaves the output of the detecting unit 1022 and outputs the deinterleaving result to the LDPC decoding unit 1023.

In the above-described embodiment, LDPC decoding unit 1023 performs the LDPC decoding operation on the basis of the derivative check matrix reconstructed by the check matrix reconstructing unit 1024. Instead of this, however, the LDPC decoding unit 1023 may, for example, perform the LDPC decoding operation on the basis of the initially preset reference check matrix and, during iterative operation of this LDPC decoding operation, perform the LDPC decoding operation on the basis of derivative check matrix reconstructed by the check matrix reconstructing unit 1024.

Figure 12:
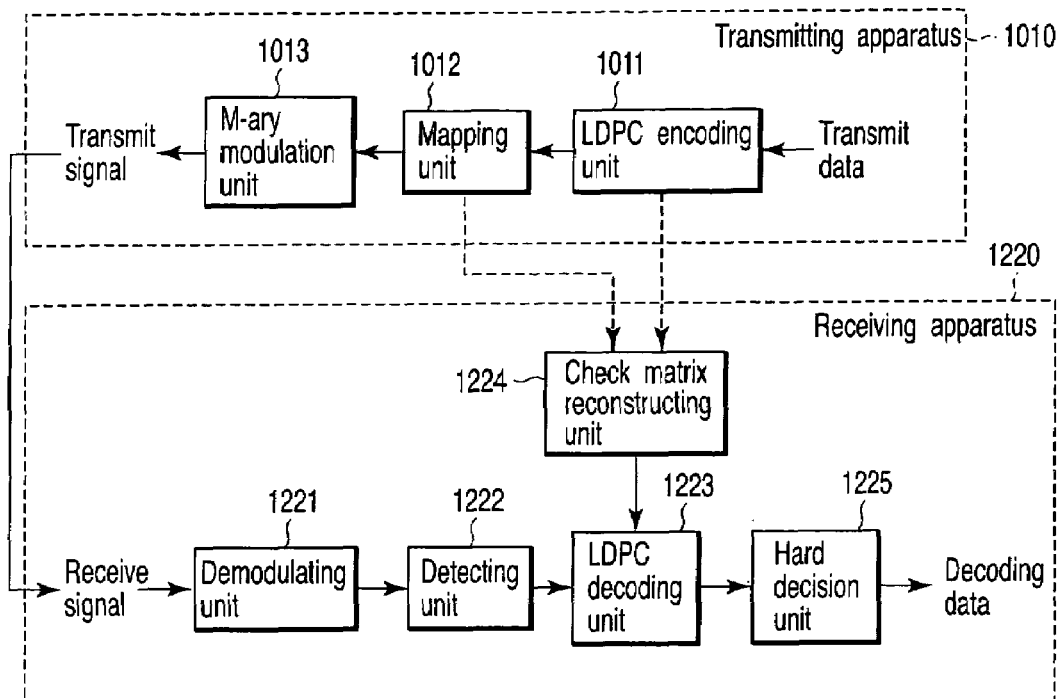
FIG. 12 shows a block diagram of a communications system to which a modified example of the receiving apparatus shown in FIG. 10 is applied.

Moreover, a structure shown in FIG. 12 can also be conceived. In a decoding apparatus shown in FIG. 12, the decoding result initially obtained by the LDPC decoding unit 1023 of the decoding apparatus shown in FIG. 10 is reflected on the detection result of the detecting unit 1022 as a weighting factor. A structure of the transmitting apparatus 1010 is the same as that shown in FIG. 10.

In FIG. 12, a detecting unit 1222 outputs a likelihood value of each of bits in an encoded bit sequence by detecting a demodulation result of a demodulating unit 1221. The likelihood value of each bit is temporarily stored in a buffer memory provided inside the detecting unit 1222 and output to an LDPC decoding unit 1223.

A check matrix reconstructing unit 1224 stores the reference check matrix employed for LDPC coding in the transmitting apparatus 1010 and corresponds to the mapping algorithm of the mapping unit 1012. In accordance with the reference check matrix and the mapping algorithm, the check matrix reconstructing unit 1224 reconstructs the reference check matrix and obtains a check matrix (hereinafter called derivative check matrix) derived from the reference check matrix. The derivative check matrix obtained by the reconstruction is the same as that obtained by the check matrix reconstructing unit 1024, and is supplied to the LDPC decoding unit 1223.

The LDPC decoding unit 1223 outputs a probability value of each of bits in the receive data by performing the LDPC decoding operation based on the derivative check matrix supplied from the check matrix reconstructing unit 1224, on the likelihood value of each of the bits in the encoded bit sequence input from the detecting unit 1222. The probability value is output to the detecting unit 1222 as a prior probability value.

The detecting unit 1222 weights each of the likelihood values stored in the buffer memory with the prior probability value corresponding thereto. Thus, the likelihood value of each of bits in the encoded bit sequence obtained by the detection is weighted with the prior probability value and the weighted likelihood value is output to the LDPC decoding unit 1223.

The LDPC decoding unit 1223 performs the LDPC decoding operation using the derivative check matrix reconstructed by the check matrix reconstructing unit 1224, on the weighted likelihood value, and obtains the probability value of each of bits in the receive data. The probability value is output to a hard decision unit 1225 as a secondary probability value. The hard decision unit 1225 executes hard decision of the secondary probability value to obtain the receive data.

As described above, in the receiving apparatus 1220, which corresponds to the M-ary modulation, the reference check matrix prestored in the check matrix reconstructing unit 1224 is reconstructed in accordance with the error rate of each bit represented by one symbol. The LDPC decoding unit 1223 first obtains the prior probability value on the basis of the derivative check matrix obtained by the reconstruction and reflects the prior probability value on the likelihood value as a weight before the LDPC decoding is performed on the likelihood value. Then the LDPC decoding operation is performed on the prior probability value in the LDPC decoding unit 1223. Higher transmission quality can be therefore obtained.

Furthermore, the channel condition detecting unit 504 of the first embodiment may be added to the receiving apparatus 1220 of FIG. 12 such that the check matrix reconstructing unit 1224 can reconstruct the reference check matrix in accordance with the reference check matrix, the mapping algorithm and the channel condition information which is detected by the channel condition detecting unit 504.

Figure 13:
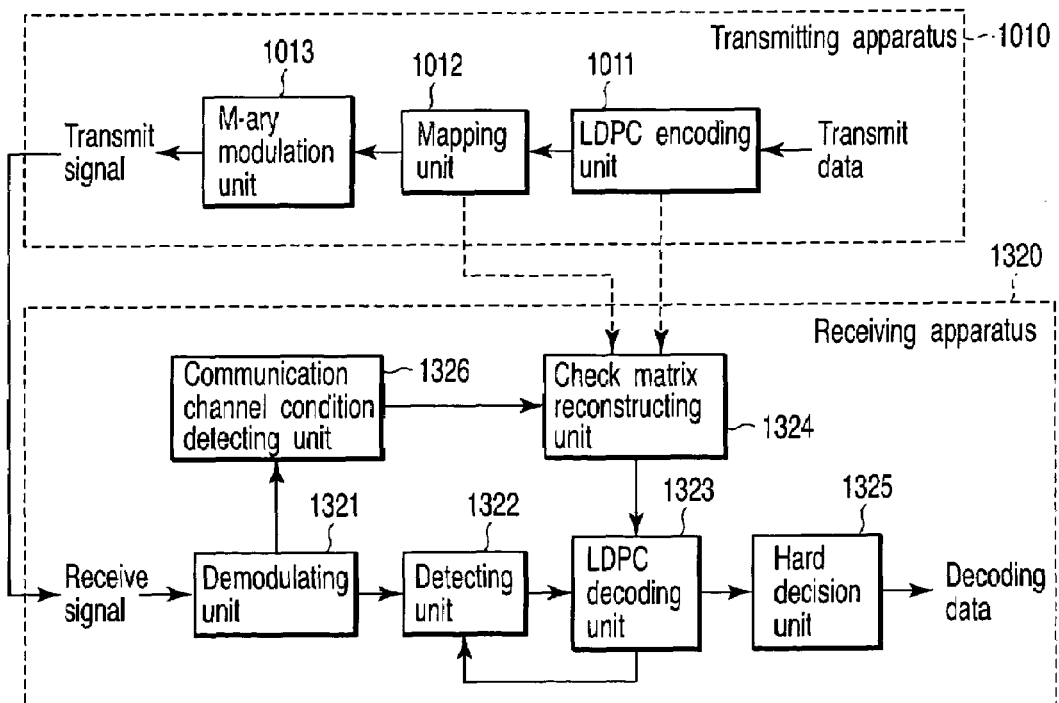
FIG. 13 shows a block diagram of a communications system to which a modified example of the receiving apparatus shown in FIG. 10 is applied.

The application is shown in FIG. 13 as a structure of a receiving apparatus 1320. The structure of the transmitting apparatus 1010 is the same as that shown in FIG. 10. In FIG. 13, a detecting unit 1322 outputs a likelihood value of each of bits in an encoded bit sequence by detecting a demodulation result of a demodulating unit 1321. The likelihood value of each bit is temporarily stored in a buffer memory provided inside the detecting unit 1322 and output to an LDPC decoding unit 1323.

A channel condition detecting unit 1326 detects a condition of the channel between the transmitting apparatus 1010 and the receiving apparatus 1320, in accordance with a pilot signal, of the demodulation result of the demodulating unit 1321. Information indicating the detected channel condition is output to a check matrix reconstructing unit 1324 as channel information.

A check matrix reconstructing unit 1324 stores the reference check matrix employed for LDPC coding in the transmitting apparatus 1010 and corresponds to the mapping algorithm of the mapping unit 1012. In accordance with the reference check matrix, the mapping algorithm and the channel information, the check matrix reconstructing unit 1324 reconstructs the reference check matrix and obtains a check matrix (hereinafter called derivative check matrix)

derived from the reference check matrix. The derivative check matrix obtained by the reconstruction is the same as that obtained by the check matrix reconstructing unit 1024, and is changed in accordance with the channel information.

The LDPC decoding unit 1323 outputs a probability value of each of bits in the receive data by performing the LDPC decoding operation based on the derivative check matrix supplied from the check matrix reconstructing unit 1324, on the likelihood value of each of the bits in the encoded bit sequence input from the detecting unit 1322. The probability value is output to the detecting unit 1322 as a prior probability value.

The detecting unit 1322 weights each of the likelihood values stored in the buffer memory with the prior probability value corresponding thereto. Thus, the likelihood value of each of bits in the encoded bit sequence obtained by the detection is weighted with the prior probability value and the weighted likelihood value is output to the LDPC decoding unit 1323.

The LDPC decoding unit 1323 performs the LDPC decoding operation using the derivative check matrix reconstructed by the check matrix reconstructing unit 1324, on the weighted likelihood value, and calculates the probability value of each of bits in the receive data. The probability value is output to a hard decision unit 1325 as a secondary probability value. The hard decision unit 1325 executes hard decision of the secondary probability value to obtain the receive data.

As described above, in the receiving apparatus 1320, which corresponds to the M-ary modulation, the reference check matrix prestored in the check matrix reconstructing unit 1324 is reconstructed in accordance with the error rate of each bit represented by one symbol. The LDPC decoding unit 1323 first obtains the primary probability value on the basis of the derivative check matrix obtained by the reconstruction and reflects the prior probability value on the likelihood value as a weight before the LDPC decoding is performed on the likelihood value. Then the LDPC decoding operation is performed on the prior probability value in the LDPC decoding unit 1323. Higher transmission quality can be therefore obtained.

In the reconstruction of the reference check matrix executed by the check matrix reconstructing unit 1324, the condition of the channel between the transmitting apparatus 101 and the receiving apparatus 1320 as detected by the channel condition detecting unit 1326 is considered. For this reason, even when the employed channel is not limited only to the binary symmetric channel, but also the channel changed in time and frequency, decoding can be executed by reconstructing the check matrix in accordance with the channel condition and high transmission quality can be thereby obtained. In addition, since negotiation with the transmitting side does not need to be made, the efficiency of use of the channel is not lowered and the speed of adapting to the channel condition is high.

Figure 14:
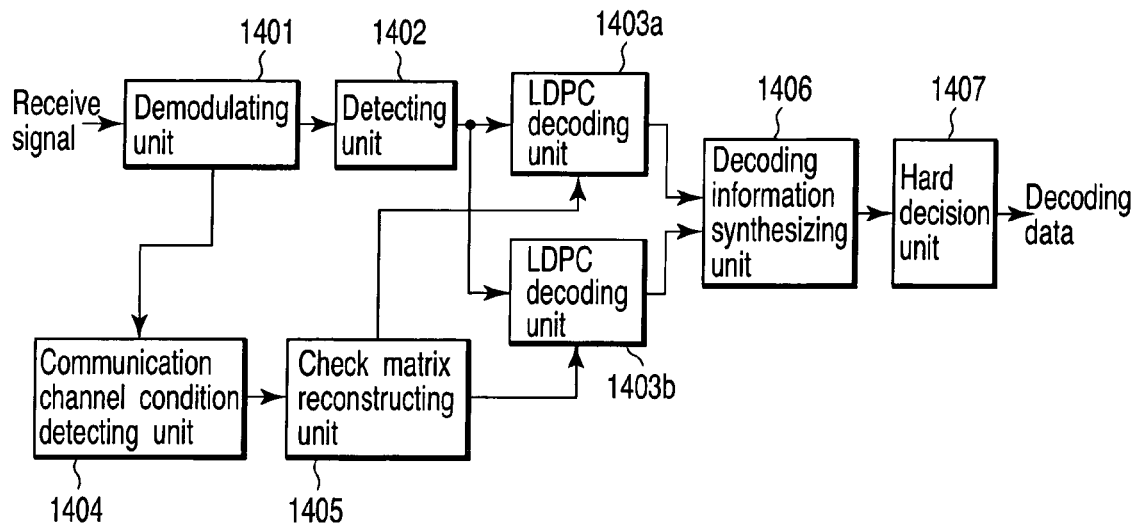
FIG. 14 shows a block diagram of a receiving apparatus according to a third embodiment of the present invention.

Next, a receiving apparatus according to a third embodiment of the present invention will be described. FIG. 14 shows a structure of the receiving apparatus. The receiving apparatus comprises a demodulating unit 1401, a detecting unit 1402, LDPC decoding units 1403*a* and 1403*b*, a channel condition detecting unit 1404, a check matrix reconstructing unit 1405, a decoding information synthesizing unit 1406 and a hard decision unit 1407.

The demodulating unit 1401 receives a radio signal transmitted from a transmitting apparatus via an antenna (not shown) and demodulates the received radio signal in the scheme of, for example, 8PSK. The detecting unit 1402 obtains a likelihood value of each of bits in an encoded bit sequence by detecting a demodulation result of the demodulating unit 1401. The likelihood value of each bit is output to each of the LDPC decoding units 1403*a* and 1403*b*.

The channel condition detecting unit 1404 detects a condition of the channel between the transmitting apparatus and the receiving apparatus, in accordance with a pilot signal, of the demodulation result of the demodulating unit 1401. Information indicating the detected channel condition is output to the check matrix reconstructing unit 1405 as channel information.

A check matrix (hereinafter called reference check matrix) employed for LDPC coding in the transmitting apparatus is stored in the check matrix reconstructing unit 1405. The check matrix reconstructing unit 1405 reconstructs the reference check matrix in accordance with the channel information supplied from the channel condition detecting unit 1404 and obtains a check matrix (hereinafter called derivative check matrix) derived from the reference check matrix. Then the check matrix reconstructing unit 1405 supplies the derivative check matrix obtained by the reconstructing to the LDPC decoding unit 1403*a* and the reference check matrix to the LDPC decoding unit 1403*b*.

The LDPC decoding units 1403*a* and 1403*b* calculate a probability value of each of bits in the receive data by performing the LDPC decoding operation based on the derivative check matrix supplied from the check matrix reconstructing unit 1405, on the likelihood value of each of the bits in the encoded bit sequence input from the detecting unit 1402.

The decoding information synthesizing unit 1406 synthesizes the probability values obtained respectively by the LDPC decoding units 1403*a* and 1403*b* in a bit unit corresponding thereto and outputs the synthesized probability value to the hard decision unit 1407. The hard decision unit 1407 performs hard decision on the probability value obtained by the synthesis and obtains the receive data.

As described above, the receiving apparatus comprises two LDPC decoding units 1403*a* and 1403*b*, urges the decoding units to perform the LDPC decoding operation based on the check matrices different from each other, and synthesizes two operation results of the check matrices to obtain the decoding data.

Thus, even if the channel condition is changed, suitable LDPC decoding operation can be executed in either of the LDPC decoding units 1403*a* and 1403*b* as compared with employing the single LDPC decoding unit and high transmission quality can be thereby obtained.

Furthermore, the receiving apparatus monitors the condition of the channel with the transmitting apparatus by the channel condition detecting unit 1404 and urges the LDPC decoding unit 1403*a* to execute decoding by the LDPC decoding operation based on the derivative check matrix reconstructed in accordance with the monitoring result.

Therefore, even when the employed channel is not limited only to the binary symmetric channel, but also the channel changed in time and frequency, decoding can be executed by reconstructing the derivative check matrix in accordance with the channel condition and high transmission quality can be thereby obtained. In addition, since negotiation with the transmitting side does not need to be made, the efficiency of use of the channel is not lowered and the speed of adapting to the channel condition is high.

The present invention is not limited to the above-described embodiment. The decoding results of the LDPC decoding units 1403*a* and 1403*b* are synthesized in the decoding information synthesizing unit 1406. For example, however, a selecting unit and a control unit may be provided instead of the decoding information synthesizing unit 1406 and the selecting unit may selectively output either of the decoding results of the LDPC decoding units 1403a and 1403b to the hard decision unit 1407. In this case, switching control of the selecting unit is conducted by the control unit. The selection of the selecting unit is considered to depend on the detection result of the channel condition detecting unit 1404, the monitoring results of qualities of the decoding results of the LDPC decoding units 1403a and 1403b, and the like.

Since the LDPC decoding units 1403a and 1403b performs the LDPC decoding operation on the basis of the check matrices different from each other, the times passing before iterative operations of the decoding converge may probably be different. However, a control unit to monitor proceeding conditions of both the operations can be provided such that when syndrome of one of the decoding units becomes "0" the control unit ends the decoding of the other decoding unit.

In addition, this embodiment can also be applied to a case where the transmit data is interleaved in the transmitting apparatus. In this case, a deinterleaver is provided immediately after the detecting unit 1402. The deinterleaver deinterleaves the output of the detecting unit 1402 and outputs this result to the LDPC decoding units 1403a and 1403b.

In the above-described embodiment, the LDPC decoding unit 1403a performs the LDPC decoding operation on the basis of the derivative check matrix reconstructed by the check matrix reconstructing unit 1405.

Instead of this, for example, the LDPC decoding unit 1403a may perform the LDPC decoding operation on the basis of the initially preset reference check matrix and, during iterative operation of this LDPC decoding operation, perform the LDPC decoding operation on the basis of derivative check matrix reconstructed by the check matrix reconstructing unit 1405.

Reconstructing the check matrix by the check matrix reconstructing unit 1405 may be executed for each block of the LDPC. In addition, a plurality of blocks may be decoded by employing the same check matrix on the basis of the detection result of the channel condition detecting unit 1404.

Figure 15:
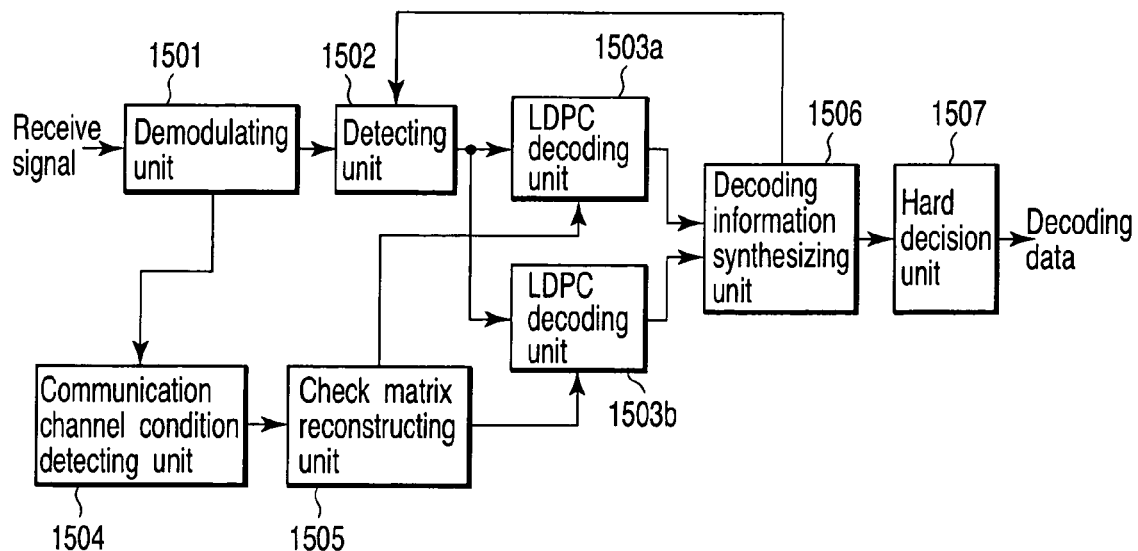
FIG. 15 shows a block diagram of a modified example of the receiving apparatus shown in FIG. 14.

Moreover, a structure shown in FIG. 15 can also be conceived. In a decoding apparatus shown in FIG. 15, the decoding result initially obtained by the decoding information synthesizing unit 1406 of the decoding apparatus shown in FIG. 14 is reflected on the detection result of the detecting unit 1402 as a weighting factor.

In FIG. 15, a detecting unit 1502 obtains a likelihood value of each of bits in an encoded bit sequence by detecting a demodulation result of a demodulating unit 1501. The likelihood value of each bit is temporarily stored in a buffer memory provided in the detecting unit 1502 and is output to LDPC decoding units 1503a and 1503b.

A channel condition detecting unit 1504 detects a condition of the channel between the transmitting apparatus and the receiving apparatus, in accordance with a pilot signal, of the demodulation result of the demodulating unit 1501. Information indicating the detected channel condition is output to a check matrix reconstructing unit 1505 as channel information.

A check matrix (hereinafter called reference check matrix) employed for LDPC coding in the transmitting apparatus is stored in the check matrix reconstructing unit 1505. The check matrix reconstructing unit 1505 reconstructs the reference check matrix in accordance with the channel information supplied from the channel condition detecting unit 1504 and obtains a check matrix (hereinafter called derivative check matrix) derived from the reference check matrix. Then the check matrix reconstructing unit 1505 supplies the derivative check matrix obtained by the reconstructing to the LDPC decoding unit 1503a and the reference check matrix to the LDPC decoding unit 1503b.

The LDPC decoding units 1503a and 1503b output a probability value of each of bits in the receive data by performing the LDPC decoding operation based on the derivative check matrix supplied from the check matrix reconstructing unit 1505, on the likelihood value of each of the bits in the encoded bit sequence input from the detecting unit 1502.

A decoding information synthesizing unit 1506 synthesizes the probability values obtained respectively by the LDPC decoding units 1503a and 1503b in a bit unit corresponding thereto. The synthesized probability value is output to the detecting unit 1502 as a primary probability value.

The detecting unit 1502 weights each of the likelihood values stored in the buffer memory with the primary probability value corresponding thereto. Thus, the likelihood value of each of bits in the encoded bit sequence obtained by the detection is weighted with the prior probability value and the weighted likelihood value is output to the LDPC decoding units 1503a and 1503b.

Each of the LDPC decoding units 1503a and 1503b performs the LDPC decoding operation based on the check matrix supplied from the check matrix reconstructing unit 1505, on the likelihood value of each of bits in the encoded bit sequence input from the detecting unit 1502 and obtains the probability value of each of bits in the receive data.

The decoding information synthesizing unit 1506 synthesizes the probability values obtained respectively by the LDPC decoding units 1503a and 1503b in a bit unit corresponding thereto. The probability value obtained by the synthesis is output to the detecting unit 1502 as a secondary probability value.

The secondary probability value is output to the hard decision unit 1507. The hard decision unit 1507 performs hard decision on the secondary probability value and obtains the receive data.

As described above, in the receiving apparatus, the probability values are obtained by the LDPC decoding units 1503a and 1503b, respectively. After that, the synthetic value (prior probability value) of the obtained probability values is reflected on the likelihood value to be the LDPC decoding as the weighting and is further subjected to the LDPC decoding in the LDPC decoding units 1503a and 1503b. Higher transmission quality can be therefore obtained.

In the receiving apparatus shown in FIG. 14 or FIG. 15, the channel condition detecting unit 1404 or 1504 is provided to reconstruct the reference check matrix in accordance with the channel condition. Instead of this or in addition to this, for example, the check matrix reconstructing unit 1405 or 1505 may correspond to the M-ary modulation and reconstruct the reference check matrix in accordance with the error rate of each bit represented by one symbol, similarly to the check matrix reconstructing unit 1024 shown in FIG. 10.

The present invention is not limited to the embodiments described above but the constituent elements of the invention can be modified in various manners without departing from the spirit and scope of the invention. Furthermore, various aspects of the invention can also be extracted from any appropriate combination of a plurality of constituent elements disclosed in the embodiments. Some constituent elements may be deleted in all of the constituent elements disclosed in the embodiments. The constituent elements described in different embodiments may be combined arbitrarily.

In the above-described embodiments, the present invention is applied to the radio communications system but is not limited to this. The present invention can also be applied to various wired devices such as communications devices, hard disk drives, audio equipment and the like, capable of inputting, outputting and transmitting the information by using the LDPC code.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A decoding apparatus capable of decoding data encoded with an LDPC code, the encoded data being transmitted from a transmitter, comprising:
   a detecting unit configured to detect a received signal to obtain a likelihood value of each of binary bits of the encoded data;
   a check matrix reconstruction unit configured to reconstruct a check matrix of a preset LDPC code by matrix manipulations to obtain a derivative matrix of the check matrix; and
   a decoding unit configured to decode the encoded data by using the likelihood value in accordance with the derivative matrix.

2. The decoding apparatus according to claim 1, further comprising a channel condition detecting unit configured to detect a condition of a transmission channel of the received signal,
   wherein the check matrix reconstruction unit reconstruct the check matrix by matrix manipulations based upon a detectionresult of the channel condition detecting unit, to obtain the derivative matrix.

3. The decoding apparatus according to claim 1, further comprising
   a demodulating unit configured to demodulate a signal generated by M-ary modulation assigning a plurality of binary data items in the encoded data to a signal point.

4. The decoding apparatus according to claim 3, wherein the check matrix reconstruction unit reconstructs the check matrix of the preset LDPC code to matrix manipulations in accordance with a reliability of each of the plurality of binary bits assigned to the signal point to obtain the derivative matrix of the check matrix.

5. The decoding apparatus according to claim 1, further comprising a channel condition detecting unit which detects a condition of a channel of the received signal,
   wherein the check matrix reconstruction unit reconstructs the check matrix to the matrix manipulations in accordance with the reliability of each of the plurality of binary bits assigned to the signal point and a detection result of the channel condition detecting unit to obtain the derivative matrix.

6. A decoding apparatus capable of decoding data encoded with an LDPC code, the encoded data being transmitted from a transmitter, comprising:
   a detecting unit configured to detect a received signal to obtain a likelihood value of each of binary bits of the encoded data;
   a check matrix reconstruction unit configured to reconstruct a check matrix of a preset LDPC code by matrix manipulations to obtain a derivative matrix of the check matrix;
   a first decoding unit configured to decode the encoded data by using the likelihood value in accordance with the derivative matrix;
   a second decoding unit configured to decode the encoded data by using the likelihood value in accordance with the derivative matrix; and
   a decoding information synthesizing unit configured to generate a decoded data based on the output of the decoded the first decoding unit and the second decoding unit.

7. The decoding apparatus according to claim 6, further comprising
   a demodulating unit configured to demodulate a signal generated by Mary modulation assigning a plurality of binary data items in the encoded data to a signal point.

8. A decoding method for decoding data encoded with an LDPC code, the encoded data being transmitted from a transmitter, comprising:
   detecting a received signal to obtain a likelihood value of each of binary bits of the encoded data;
   reconstructing a check matrix of a preset LDPC code by matrix manipulations to obtain a derivative matrix of the check matrix; and
   decoding the encoded data by using the likelihood value in accordance with the derivative matrix.

9. The decoding method according to claim B, further comprising detecting a channel condition of a transmission channel of the received signal transmitted from the transmitter,
   wherein the reconstruct of the check matrix by matrix manipulations corresponding to a detection result of the channel condition, to obtain the derivative matrix.

10. The decoding method according to claim 8, further comprising
    demodulating a signal generated by M-ary modulation assigning a plurality of binary data items in the encoded data to a signal point.

* * * * *

UNITED STATES PATENT AND TRADEMARK OFFICE
CERTIFICATE OF CORRECTION

PATENT NO.         : 7,337,385 B2
APPLICATION NO. : 11/158061
DATED              : February 26, 2008
INVENTOR(S)        : Harada It is certified that error appears in the above-identified patent and that said Letters Patent is hereby corrected as shown below:

Claim 2, column 15, line 40, change "detectionresult" to --detection result--.

Claim 7, column 16, line 30, change "Mary" to --M-ary--.

Claim 9, column 16, line 42, change "claim B," to --claim 8,--.

Signed and Sealed this

Tenth Day of June, 2008

JON W. DUDAS
*Director of the United States Patent and Trademark Office*